(12) United States Patent
Solomon et al.

(10) Patent No.: US 6,498,113 B1
(45) Date of Patent: Dec. 24, 2002

(54) FREE STANDING SUBSTRATES BY LASER-INDUCED DECOHERENCY AND REGROWTH

(75) Inventors: Glenn S. Solomon, Redwood City, CA (US); David J. Miller, San Francisco, CA (US)

(73) Assignee: CBL Technologies, Inc., Redwood City, CA (US)

( * ) Notice: Subject to any disclaimer, the term of this patent is extended or adjusted under 35 U.S.C. 154(b) by 0 days.

(21) Appl. No.: 09/874,939

(22) Filed: Jun. 4, 2001

(51) Int. Cl.⁷ ............................................. H01L 21/31
(52) U.S. Cl. ..................................................... 438/778
(58) Field of Search .................................. 438/458, 483, 438/795, 796, 46, 487, 767, 778, 779

(56) References Cited

U.S. PATENT DOCUMENTS

| | | | |
|---|---|---|---|
| 5,583,351 A | | 12/1996 | Brown et al. .................. 257/89 |
| 5,620,557 A | | 4/1997 | Manabe et al. .............. 438/507 |
| 5,679,152 A | | 10/1997 | Tischler et al. ............... 117/97 |
| 6,071,795 A | * | 6/2000 | Cheung et al. .............. 438/458 |
| 6,113,685 A | * | 9/2000 | Wang et al. .................... 117/3 |
| 6,150,239 A | * | 11/2000 | Goesele et al. .............. 438/458 |
| 6,156,581 A | * | 12/2000 | Vaudo et al. .................. 438/22 |
| 6,176,925 B1 | | 1/2001 | Solomon et al. .............. 117/89 |
| 6,204,151 B1 | * | 3/2001 | Malik et al. ................. 438/460 |
| 6,303,405 B1 | * | 10/2001 | Yoshida et al. ............... 438/46 |

OTHER PUBLICATIONS

Wong, W.S. et al., "Damage–free Separation of GaN Thin Films Frop Sapphire Substrates", Applied Physics Letters vol. 72, No. 5, Feb. 2, 1998, pp. 599–601.

* cited by examiner

*Primary Examiner*—Hoai Ho
*Assistant Examiner*—Quoc Hoang
(74) *Attorney, Agent, or Firm*—JDI Patent; Joshua D. Isenberg (57) ABSTRACT

A method for the production of crack-free Group III-Nitride layers is disclosed. The method proceeds by growing a crack-free first layer of Group III-Nitride on a starting substrate. A partial to complete loss of coherency is then achieved between a lattice of the first layer and a lattice of the starting substrate. A second layer is grown to form a composite layer that includes the first layer and the second layer such that the first layer is between the second layer and the substrate. The starting substrate may then be completely separated from the composite layer to produce the freestanding crack-free Group III-Nitride layer.

73 Claims, 6 Drawing Sheets

FREE STANDING SUBSTRATES BY LASER-INDUCED DECOHERENCY AND REGROWTH

FIELD OF THE INVENTION

The invention relates to a method for the production of a high quality free-standing layer of Gallium Nitride or similar material by heteroepitaxial deposition and subsequent removal from a transparent substrate.

BACKGROUND

Gallium Nitride (GaN) has been recognized as having great potential as a technological material. For example, GaN is used in the manufacture of blue light emitting diodes, semiconductor lasers, and other opto-electronic devices, as well as in the fabrication of high-temperature electronics devices.

One of the greatest challenges for the large-scale production of GaN-based devices is the lack of a suitable native GaN substrate. GaN is not found in nature; it cannot be melted and pulled from a boule like silicon, gallium arsenide, sapphire, etc., because at reasonable pressures its theoretical melting temperature exceeds its dissociation temperature. However, the fabrication of very high crystal quality, thin layers of GaN, and its related alloys, for use in electronic devices, requires that they be deposited homoepitaxially onto an existing GaN surface. Such high quality device layers cannot be directly grown heteroepitaxially, for reasons that are outside the scope of this invention.

The techniques currently in use for the fabrication of high quality GaN and related layers involve the heteroepitaxial deposition of a GaN device layer onto a suitable but non-ideal substrate. Currently such substrates include (but are not limited to) materials such as sapphire, silicon, silicon carbide, gallium arsenide, lithium gallate, lithium aluminate, and lithium aluminum gallate. All heteroepitaxial substrates present challenges to the high-quality deposition of GaN, in the form of lattice and thermal mismatch. Lattice mismatch is caused by the difference in interatomic spacing of atoms in dissimilar crystals. Thermal mismatch is caused by differences in the coefficient of thermal expansion (CTE) between joined dissimilar materials, as the temperature is raised or lowered.

For the purpose of clarity, heteroepitaxial growth is defined herein as a process whereby the atomic lattices of two dissimilar materials are intimately joined together by atomic bonds across their common interface. When the cross-linking bonds are made in a regular and orderly array displaying long-range order, the interface is said to be coherent. When the cross-linking bonds are broken, bent, twisted, or otherwise distorted such that there is no long-range order, the interface is said to have lost coherency. Coherent interfaces are much stronger than incoherent interfaces, due to the greater number of cross-linking bonds between the materials. The loss of coherency may be partial; if only a percentage of cross-linking bonds are broken or distorted in an interface, the interface is partially coherent. The percentage (by area) of broken or distorted bonds represents the level of incoherency or loss of coherency for that interface.

The most commonly used heteroepitaxial substrate for GaN deposition is sapphire ($Al_2O_3$), which has both a large thermal mismatch and a large lattice mismatch compared to GaN. In addition, the sapphire substrate is not electrically conductive, and has poor thermal conductivity, limiting its heat sinking capabilities, further reducing device performance and complicating device processing. For reasons unrelated to the scope of this invention, sapphire otherwise possesses superior properties as a hetero-substrate. However, the large lattice mismatch results in films that have very high defect densities, specifically in the form of dislocations, which are especially undesirable from a device fabrication point of view. (The formation of dislocations at regular intervals along the interface does not affect its coherency, as defined for the purposes of this application, for the dislocations themselves exhibit a type of long-range order in their distribution.) As with other epitaxial crystal growth processes, it is necessary to grow a buffer layer of GaN on the sapphire surface prior to the formation of device-quality layers. The buffer layer will vary, depending on device tolerance to dislocations, whether or not special growth techniques (such as growth through a mask pattern, use of low temperature buffer layers, etc.) are employed, as well as other factors. Typically, this GaN buffer thickness is less than one micron to tens of microns thick. Defect densities, however, predominantly in the form of dislocations, remain high ($\sim 10^{10}$ $cm^{-2}$) resulting in diminished device quality. In addition to the conventional buffer layer, a low temperature GaN buffer layer is nearly always used. This layer is the first layer deposited on the sapphire. The buffer layer is initially amorphous and typically is 30–50 nm thick; it is recrystallized at the growth temperature.

Besides dislocations and lattice mismatch problems, thermal mismatch is also a consideration. Typically the GaN is deposited onto sapphire at a temperature of between 1000–1100° C.; as the sample cools to room temperature, the difference in thermal expansion (contraction) rates gives rise to high levels of stress at the interface between the two materials. Sapphire has a higher coefficient of thermal expansion (CTE) than does GaN. As the sapphire substrate and GaN layer cool, the mismatch at the interface puts the GaN under compression and the sapphire under tension. Up to a point, the amount of stress is directly related to the thickness of the deposited GaN, such that the thicker the film, the greater the stress. Above a film thickness of approximately 10 microns, the stress levels exceed the fracture limits of the GaN, and cracking and peeling of the film may result. Cracks in this layer are much less desirable than high dislocation densities, and should be avoided because of the risk of their catastrophic propagation into the device layer during subsequent processing steps.

One method to prevent such thermal stress-related problems involves separating the sapphire substrate from the deposited film. This may be done by physically removing the substrate (lapping and polishing), or by focusing a very high-intensity light source (such as from a laser) from the substrate side of the sample. The light source emits photons having an emission energy that is not absorbed by the sapphire. This second technique utilizes the difference in absorption between the two materials: GaN has a room temperature electron bandgap of approximately 3.45 eV, whereas sapphire has a bandgap of 9.9 eV. Photons with an energy greater than approximately 3.45 eV and less than 9.9 eV (corresponding to vacuum wavelengths less than 359 nm but greater than 125 nm) are able to pass through the back side of a sapphire wafer, where they are absorbed in various amounts, depending on energy, by the GaN at the interface. Once absorbed, the photons are converted to heat, which locally disrupts the Ga—N bonds. If the incident radiation is intense enough, large-scale local disruption results in a complete loss of coherency between the lattice of the sapphire substrate and the GaN. At lower radiation levels, the loss of coherency may only be partial and incomplete, resulting in a film that is still attached to the sapphire substrate, but is no longer completely bonded to it.

Both aforementioned techniques have limitations. A free-standing film must be sufficiently thick to have the required mechanical strength necessary for subsequent device processing. Typically, this requires a minimum thickness on the order of 50–100 microns. Deposition of a crack-free film with this thickness onto sapphire is feasible if done carefully, however thermal stresses will cause severe bowing in the wafer as it cools to room temperature. Conventional lapping and polishing processes are not effective at removing a concave substrate; alternatively, use of a laser to remove the GaN from the sapphire can create unstable localized regions of stress in the partially-removed film, leading to layer fracture during the lift-off process.

Figure 1:
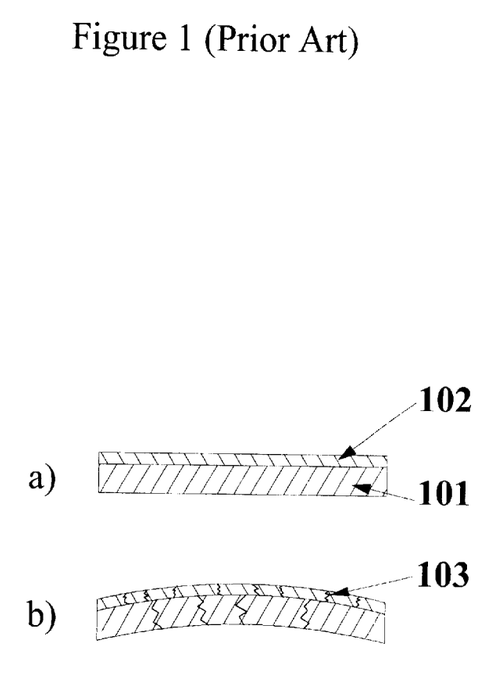
FIGS. 1a and 1b are cross sectional schematic views showing conventional (prior art) heteroepitaxial growth of thick GaN on sapphire.

Referring to the drawings, FIGS. 1(a)–1(b) schematically illustrate the prior art when deposition of a thick layer of GaN onto sapphire is desired. In FIG. 1(a), sapphire substrate 101 has a thick (greater than 10 microns) film of GaN 102 deposited onto it, at the growth temperature, which may be in the range of 1000–1100° C. The actual method of deposition is not relevant to this invention. Because the film of GaN nucleates onto the substrate at this temperature, there is no thermal stress present. FIG. 1(b) shows the effects of the large temperature change as the sample cools to room temperature. In this figure, sapphire substrate 101 is now under compressive stress and is bent concave with respect to the deposited film. If the stresses are great enough, cracks 103 may form in the substrate. The epitaxial GaN 102 is under tensile stress, and is cracked, and may also peel away from or otherwise degrade the interface with substrate 101.

Figure 2:
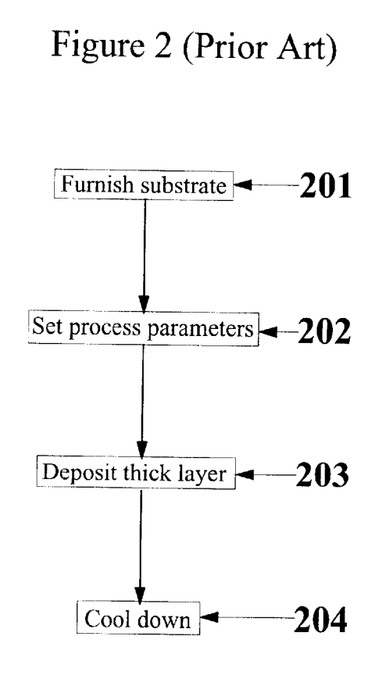
FIG. 2 schematically shows the process steps for the conventional thick heteroepitaxial growth of GaN.

FIG. 2 schematically represents a series of steps involved in the conventional method for making a thick layer on a thermally and/or lattice mismatched substrate. Step 201 calls for the provision of a prepared substrate. This prepared substrate may be, for example, plain sapphire, chemically cleaned prior to use. Step 202 is the setting of process parameters and growth conditions for the growth of the thick, flat, high quality layer. Typically these conditions are growth temperature, growth rate, flow rates for precursor compounds, and relative ratios of gas flows in the reactor. Step 203 calls for the deposition of the thick layer 102 onto the prepared substrate. The thickness of this layer is preferentially in the range of 10–400 microns. In step 204, the sample is cooled down to room temperature where it is removed, intact, from the reactor. The wafer is bowed due to the residual stress caused by the thermal mismatch between the epitaxial layer and the substrate. This stress also leads to the formation of many cracks 103 in the thick layer and the substrate.

Figure 3:
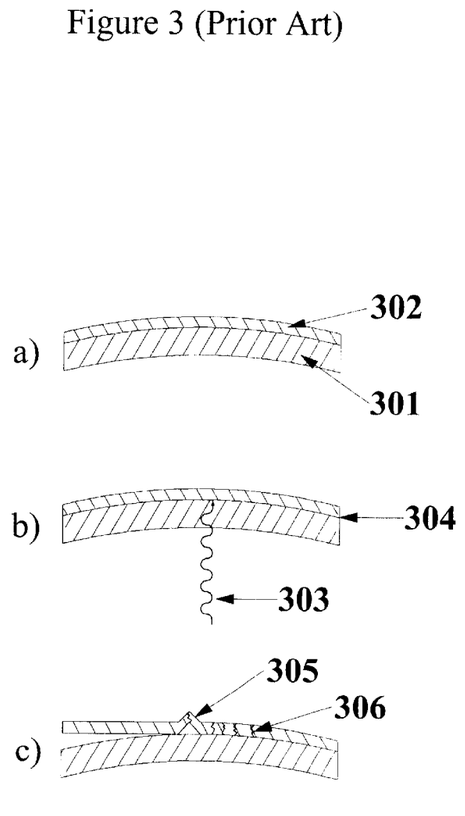
FIGS. 3a–c are cross-sectional schematic views showing a conventional (prior art) technique for the laser lift-off of a GaN film from a sapphire substrate.

FIGS. 3(a)–3(d) schematically illustrate the prior art technique of using laser lift-off (LLO) to release a deposited GaN film from the sapphire substrate. In FIG. 3(a), sapphire substrate 301 has had a film of GaN 302 deposited onto it, at the growth temperature, and has subsequently been cooled to room temperature. Film 302 is deposited in such a manner that cracks do not form during the cooling down stage. In FIG. 3(b), laser beam 303 impinges upon the back side of the sapphire substrate. The laser is of an energy such that its photons are strongly absorbed by the GaN layer, while passing through the sapphire largely unabsorbed. Typically the energy range of such photons is above 3.45 eV, corresponding to a wavelength (in vacuum) of less than 359 nm but greater than 125 nm. The source of these photons is typically a pulsed ultraviolet laser, such as a tripled YAG or excimer laser; however the characteristics that are important for this process are not laser-specific. Any highly intense light source that can be focused down to a spot will suffice. Because the beam impinges from the sapphire side of the wafer, the GaN at the sapphire/GaN interface 304 absorbs the photons very strongly, resulting in localized heating. This localized heating is sufficient to disrupt the Ga—N bonds, breaking the strained but coherent interface between the lattice of the substrate 301 and the film 302. Typically, the laser beam is swept across the backside of the wafer to gradually release the epitaxial film from the substrate. If the beam is sufficiently intense, all bonds will be broken, isolating the two lattices. A less intense beam may be used to partially disrupt the interface, breaking as few as 5% of the bonds, if such an effect is desired. In FIG. 3(c) the process has continued. If the laser beam is too intense or not swept properly, localized hot areas can develop where the pressure from liberated nitrogen gas beneath the epitaxial film can build up and cause a rupture in the surface of the film, 305. Additionally, residual thermal stresses in the as-yet unreleased areas can cause cracks 306 to develop in the film, especially as the stress profile changes during the debonding process. Both of these effects are undesirable and must be avoided, typically by careful modulation of the impinging laser power and scan rate, choosing a laser with a short pulse length, and/or using a beam homogenizer to form an illuminated spot with uniform intensity, among other techniques. Even with such precautions, cracking of the released epitaxial film may still occur, preventing the lift-off and removal of a whole layer to be used as a free-standing substrate.

Figure 4:
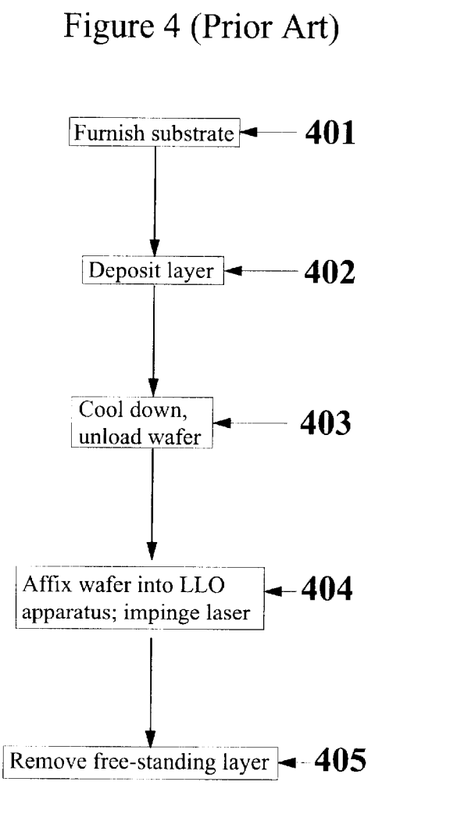
FIG. 4 schematically shows the process steps for the laser lift-off of a GaN film from a sapphire substrate, using the prior art.

FIG. 4 schematically represents a series of steps involved in the conventional method for laser lift-off of a GaN film from a sapphire substrate. In step 401 a prepared substrate is provided. This prepared substrate may be, for example, plain sapphire, chemically cleaned prior to use. In step 402, the substrate has a layer of GaN 302 deposited onto it at an elevated growth temperature. In step 403 the substrate with GaN epitaxy is allowed to cool to the ambient temperature and is unloaded from the growth apparatus. In step 404 the grown wafer is placed into the LLO apparatus, which typically consists of a laser, laser power regulator, a wafer holder, and a beam steering mechanism to allow the beam 303 to impinge over the entire backside surface of the wafer. The beam then impinges over the backside of the wafer, gradually debonding the epitaxial film from the sapphire. In step 405, the debonding is complete, the debonded epitaxial film is removed from the sapphire by heating the wafer above 30° C. (the melting point of gallium metal) and the layers are gently pulled apart. Often, the debonded layer is cleaned in an acid solution to dissolve any remaining gallium from its backside surface. Although free-standing epitaxial GaN films may be produced by LLO, the high stress between the sapphire substrate and the GaN layer often leads to cracking, fractures and other failures in the GaN layer. Thus the yield of usable free-standing epitaxial GaN films is often unacceptably low.

Because of the problems encountered with growing thick layers of GaN on sapphire, and of the problems encountered in attempting to remove GaN from the sapphire substrate using a conventional LLO technique, a need exists for a method for the laser lift-off and removal of GaN films from sapphire substrates for the creation of high quality free-standing substrates.

SUMMARY OF THE INVENTION

The present invention provides a method for the production of crack-free Group III-Nitride layers. The method proceeds by growing a crack-free first layer of Group III-Nitride on a starting substrate. A partial to complete loss of coherency is then achieved between a lattice of the first layer and a lattice of the starting substrate. A second layer is grown to form a composite layer that includes the first layer and the second layer such that the first layer is between the second layer and the substrate.

The present invention also provides a method for the production of arbitrarily thick, crack-free, freestanding layers of GaN or similar material for subsequent use as substrates. This method proceeds by growing a crack-free first layer of Group III-Nitride on a starting substrate. A partial to complete loss of coherency between a lattice of the first layer and a lattice of the starting substrate is then achieved. A second layer is grown to form a composite layer that includes the first layer and the second layer, and where the first layer is between the second layer and the substrate. The starting substrate is then completely separated from the composite layer to produce the freestanding substrate. In both methods, an intense light source may be used to partially disrupt the interface between this layer and the underlying starting substrate, making said interface partially incoherent.

In both methods a crack-free second layer may be grown on top of a crack-free first layer that has a partially incoherent interface with respect to the underlying starting substrate.

Furthermore, a crack-free second layer may be grown on top of a crack-free first layer (which has a partially incoherent interface with respect to the underlying starting substrate), in-situ, without necessitating a further cooling-down step.

These and other objects, advantages, and features of the invention will be set forth in part in the description which follows, and in part will become apparent to those having ordinary skill in the art upon examination of the following, or may be realized and attained as particularly pointed out in the appended claims.

DETAILED DESCRIPTION OF THE PREFERRED EMBODIMENTS

For purposes of illustration, the present invention will be described primarily in relation to the fabrication of a thick freestanding layer of GaN grown on and subsequently removed from a sapphire substrate, using a suitable growth technique such as hydride vapor phase epitaxy (HVPE). It should be understood, however, that the present invention is applicable to the deposition of other materials including GaN, AlN, InN and/or their alloys, and/or onto substrates other than sapphire, and/or using other deposition techniques (such as metal organic chemical vapor deposition (MOCVD), molecular beam epitaxy (MBE), sputtering, evaporation, etc.). For the purpose of providing an example, the following embodiments are described with respect to fabrication of GaN substrates. The invention is not limited to just GaN substrates, in fact, it is intended to be utilized with other III–V materials. Those skilled in the art will recognize that the process is equally applicable to producing substrates of other group III nitrides and other III–V compounds.

First Embodiment of the Invention

Figure 5:
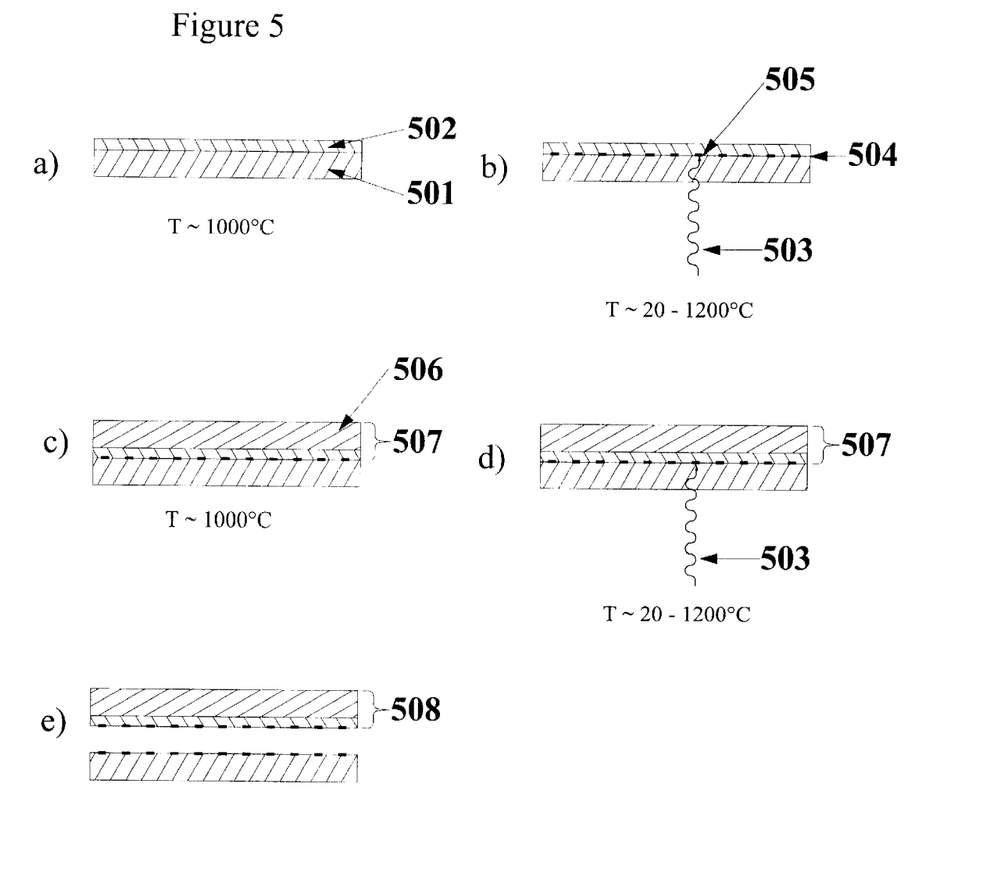
FIGS. 5a–e are cross-sectional schematic views illustrating the process for the production of a freestanding GaN substrate according to the first embodiment of the invention FIG. 6 schematically shows the process steps for the fabrication of a freestanding GaN substrate according to the first embodiment of the invention

FIGS. 5a–e schematically depict the method for fabricating a crack-free freestanding GaN layer according to the first embodiment of the invention. In FIG. 5a) a starting substrate 501 has a crack-free first layer of GaN 502 deposited by means of HVPE or other suitable method (such as MOCVD, MBE, etc.) The starting substrate 501 may be sapphire, but it may also be of any other material that is transparent to the region of the ultraviolet spectrum where the energy exceeds the bandgap of the desired III–V freestanding substrate material. The starting substrate may also be specially prepared prior to the deposition of the first layer. Such preparation may include special cleaning procedures or surface treatments, and/or the application of a low temperature buffer layer or layers, and/or the use of a patterned growth mask that allows growth only on selected areas of the starting substrate.

First layer 502 is deposited in such a way as to avoid crack formation. This may be accomplished by depositing a sufficiently thin layer (preferably between 0.1 and 10 $\mu$m) such that accumulated thermal stresses on cooling down will not exceed the physical limits of GaN. Alternatively, a thicker layer (up to 100 $\mu$m) may be deposited if the resulting film has lower potential for thermal stress accumulation, due to its higher defect density or increased surface roughness. It is primarily important, however, that first layer 502 cannot crack during deposition or during cooling down to a subsequent processing temperature. First layer 502 may also be composed of a plurality of layers of varying thickness and composition, as needed.

In FIG. 5b), the starting substrate 501 and first layer 502 have been removed from the growth reactor. First layer 502 is under some thermal stress due to the thermal mismatch between the materials, but cracks have not formed in the film. A laser beam 503 impinges upon the backside of starting substrate 501. Starting substrate 501 does not absorb these photons, whereas the GaN at the interface 504 does. Typically the photons are generated by a pulsed ultraviolet laser, two examples of which are a XeCl excimer laser (wavelength 345 nm) or a tripled YAG laser (wavelength 355 nm). Both wavelengths are strongly absorbed by GaN, which has a room temperature absorption edge of 359 nm, corresponding to an electron bandgap of 3.45 eV.

To avoid thermal mismatch effects, it is sometimes helpful to heat the starting substrate 501 and first layer 502 to an elevated temperature prior to application of the laser beam. This elevated temperature may be as high as, or higher than, the actual growth temperature used during the deposition process (typically 1000°–1100° C.). The heating effectively reduces the magnitude of the thermal strain, reducing the risk of crack formation caused by non-uniform stress fields induced during the laser process. In such cases of heating the starting substrate 501 and first layer 502 above 600° C., it may be necessary to supply a non-inert nitrogen bearing atmosphere (such as ammonia, $NH_3$) to prevent the surface of first layer 502 from suffering the effects of thermal decomposition.

Photons 503 are strongly absorbed at the interface 504, where they disrupt the Ga—N bonds, leading to a loss of coherency 505 between the lattice of the starting substrate 501 and the first layer 502. Depending on factors such as laser pulse energy, peak power, pulse duration, spot size, beam scan rate, etc. the desired loss of coherency can be adjusted from partial (fewer than 5% of bonds broken) to complete (100% of bonds broken.) The loss of coherency between the lattice of the starting substrate 501 and the lattice of the first layer 502 relieves the stress between the starting substrate 501 and the first layer 502. Although the coherency may be lost between the two lattices, the first layer 502 and starting substrate 501 are not yet physically separated.

In FIG. 5c), the starting substrate 501 with the first layer 502 is loaded again into the growth system for the deposition of the second layer 506. The thickness of the second layer 506 layer may be set arbitrarily; for use as a substrate typically the thickness of layer 506 is between 50 and 500 $\mu$m. The deposition technique and conditions for depositing the second layer 506 may be the same as, or different from the conditions used for the deposition of layer 502. Together, layers 502 and 506 merge to form a composite layer 507.

In FIG. 5d) the starting substrate 501 and composite layer 507 is again cooled and unloaded from the growth system. Although the thickness of composite layer 507 is sufficiently large to induce catastrophic thermal stress cracks, the partially disrupted interface 505 effectively limits or eliminates the transmission of stress between the dissimilar materials. Thus, cracks do not form. Laser beam 503 is again applied to the backside of the starting substrate 501 to effect the complete disruption of the Ga—N bonds at the interface, allowing the release of the composite GaN layer 507 from the starting substrate. Alternatively, as shown in FIG. 5e), if the initial level of Ga—N bond disruption caused during the first laser step was sufficiently high (>99%), the accumulated strain during the cooling process will concentrate the stresses on the remaining bonds, causing the composite layer 507 to spontaneously shear away from the starting substrate 501. In such a case, no second laser step will be necessary as the GaN substrate will spring free of the starting substrate of its own accord. Also within the scope of this invention are alternative techniques for removing the substrate from the composite layer, such as lapping and polishing, etc.

Figure 6:
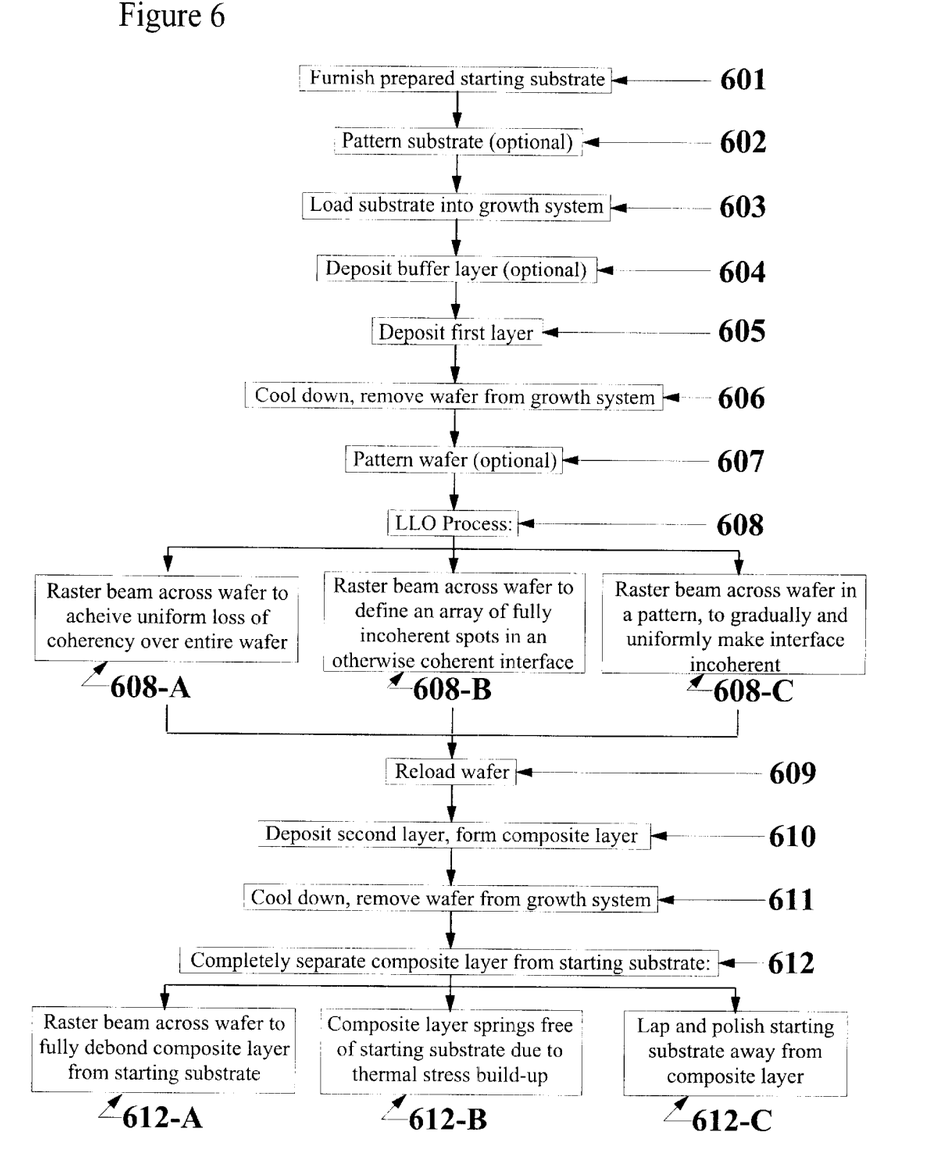

FIG. 6 schematically shows the series of steps involved in the method for producing a thick freestanding layer from GaN on a sapphire substrate, according to the first embodiment of the invention. Step 601 calls for the provision of a prepared substrate. In (optional) step 602, the prepared substrate has a mask pattern applied to its surface. The mask is intended to prevent growth except in the opened areas of the mask, in order to improve crystal quality or aid in the later separation. The mask may be of any material which inhibits growth on its surface and is compatible with the growth process; typically such masks are made of silicon oxide, silicon nitride, or silicon oxynitride.

The starting substrate is loaded into the growth system in step 603. In step 604, an optional low temperature buffer layer is set down, prior to step 605, where the initial layer of GaN is deposited onto the sapphire. This layer may consist of a single layer deposited at one temperature, or of a plurality of layers of different compositions, deposited at different temperatures. In step 606, the wafer, i.e. the starting substrate with the initial GaN layer, is cooled to ambient temperature and unloaded. In optional step 607, the wafer may be patterned with a mask, similar to that which may have been applied in optional step 602, or consisting of a different type of pattern, if desired. The purpose of the mask layer is to improve the crystal quality of material grown through and over it and/or to aid in the later removal of the film from the substrate.

In step 608, the wafer is affixed to the LLO apparatus for the partial to complete disruption of the Ga—N bonds linking the starting substrate 501 to the first layer 502. Typically, this can be done using different methods, as described herein.

In one alternative step 608-A the laser pulse intensity, pulse width, and scan rate may be modulated such that each spot induces a uniform but incomplete loss of coherency between the lattice of the GaN layer and the lattice of the sapphire substrate. The entire wafer may be uniformly illuminated, and experiences a uniform loss of coherency of between 5% and greater than 99% between the two lattices.

Alternatively, in step 608-B, the pulse intensity, width, spot size, etc. may be set to cause total disruption of the coherency at the interface of the lattice of the GaN and the lattice of the sapphire. Each illuminated spot has total loss of coherency associated with it; however the beam is swept in such a manner that the entire surface is not illuminated uniformly. Some areas of the substrate are not exposed, and have total coherency maintained, whereas others are made completely incoherent by exposure. By choosing parameters such as spot pitch distance, the ratio of area made incoherent to the total area of the wafer can be adjusted from 5% up to greater than 99%.

Alternatively, in step 608-C, the laser spot may be rastered across the backside of the wafer in a pattern, such as a spiral, square, diagonal, etc. The effect is to disrupt the coherency between the lattice of the GaN and the sapphire in a systematic fashion, reducing or eliminating the thermal stresses in a geometrically controlled way to avoid cracking.

Regardless of which approach is followed for step 608, the laser that is used is typically a tripled YAG or excimer laser, with a spot size of 50 $\mu$m to 500 $\mu$m, a pulse width of 3 to 50 nanoseconds, and a total fluence of between 300 mJ and 500 mJ per pulse. As the first layer is under thermal stress, it is often advantageous to use an auxiliary heating mechanism such as a hot plate to keep the wafer at an intermediate to high temperature during this process. For example, if the layer is grown at 1000° C., heating the wafer to 500° C. during the laser process reduces the thermal stress approximately by half, reducing the film's tendency to crack.

The wafer is loaded into the growth system in step 609, and the growth of the second GaN layer 506 is done in step 610. Thickness of this layer is preferably between 50 and 500 microns, more preferably 300 microns. The growth conditions for this layer may be the same as those used for the first layer, or they may differ in terms of growth rate, gas flows, partial pressures of precursor gases, composition of material deposited, temperature, etc. Layers 502 and 506 merge to form composite layer 507. In step 611 the wafer is cooled once again and removed from the growth system. Although the total combined thickness of composite layer 507 on the starting wafer is considerable, the partially-to-completely isolated lattices of the starting substrate 501 and first layer 502 do not transmit stresses effectively, preventing crack formation.

In step 612 the composite layer 507 is removed from the starting substrate 501. There are different methods by which this may be accomplished, as described herein.

In a first alternative step 612-A, the wafer may be affixed again into the LLO apparatus. This time, the laser is used to completely disrupt 100% of the bonds at the interface, allowing for the straightforward physical removal of the composite layer by sliding it off the sapphire wafer.

Alternatively, in step 612-B, the few remaining bonds that were left from the first laser step 608 may serve to concentrate the now-intensified thermal stress induced by the thicker second layer 506. As the wafer is cooled to the ambient temperature, the concentrated stress exceeds the physical limits of the GaN at the interface, causing the composite layer to spontaneously shear away from the sapphire substrate.

Or, alternatively, in step 612-C, the composite layer 507 is separated from the sapphire starting substrate 501 by methods such as lapping or polishing the backside of the sapphire away. As the coherency of the interface was already significantly reduced in the first laser step 608, the wafer does not experience the severe bowing that otherwise would be evident on such a wafer with a thick layer deposited onto it.

Regardless of which alternative method is used in step 612, the end result is a freestanding, crack-free GaN substrate 508 including the composite layer 507.

Second Embodiment of the Invention

Figure 7:
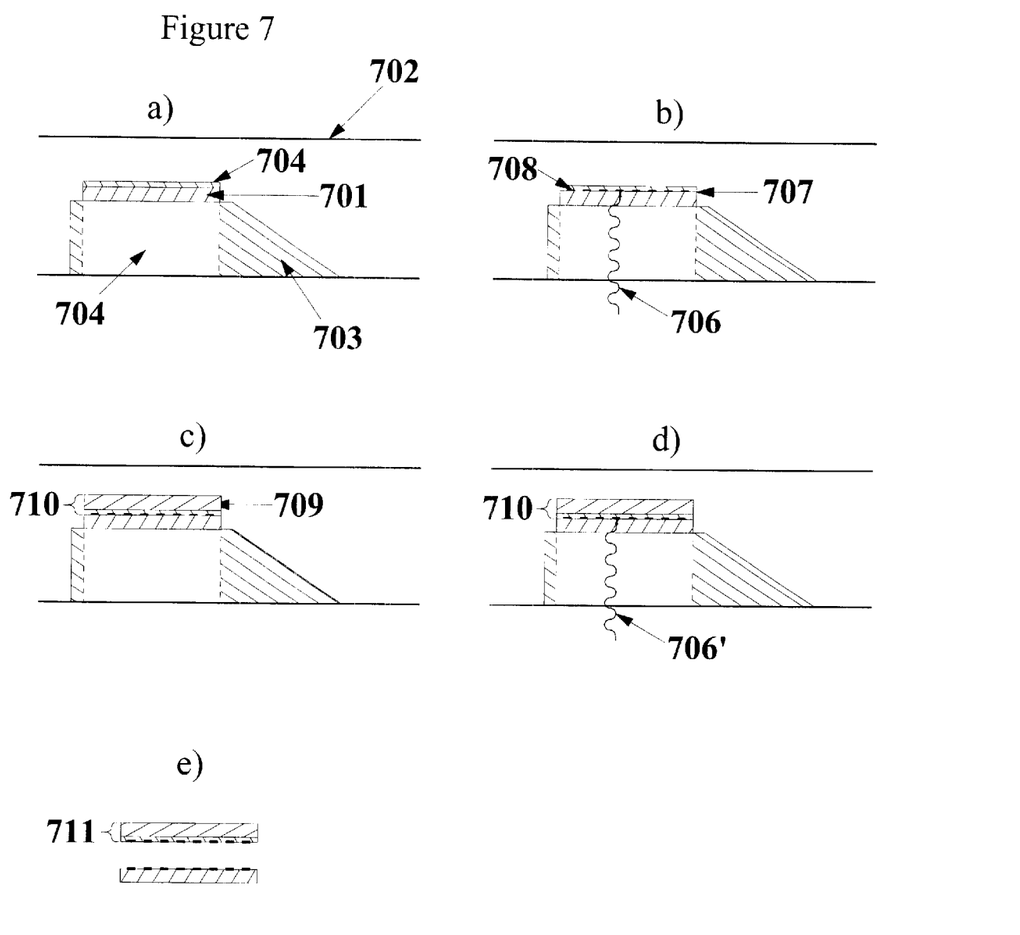
FIGS. 7a–e are cross-sectional schematic views illustrating the process for the production of a freestanding GaN substrate according to the second embodiment of the invention FIG. 8 schematically shows the process steps for the fabrication of freestanding GaN substrate according to the second embodiment of the invention.

FIGS. 7*a*–*e* schematically depict a method for fabricating a crack-free freestanding GaN layer according to the second embodiment of the invention. In FIG. 7*a*) a starting substrate 701 is loaded into a growth system 702. The growth system 702 may be, for instance, a HVPE system. Substrate 701 is placed onto a susceptor 703, which holds the substrate in position during the growth process. Susceptor 703 may be fashioned with a slit or window 704 on its underside, which is designed to allow for the free transmission of a laser beam through the susceptor onto the underside of substrate 701.

In the growth system 702, substrate 701 has a crack-free first layer of GaN 705 deposited by means of HVPE or other suitable method (such as MOCVD, MBE, etc.) The starting substrate 701 may be sapphire, but it may also be of any other material that is transparent to the region of the ultraviolet spectrum where the energy exceeds the bandgap of the desired III–V freestanding substrate material. The starting substrate may also be specially prepared prior to the deposition of the first layer. Such preparation may include special cleaning procedures or surface treatments, and/or the application of a low temperature buffer layer or layers, and/or the use of a patterned growth mask that allows growth only on selected areas of the starting substrate.

First layer 705 is deposited in such a way as to avoid crack formation. This may be accomplished by depositing a sufficiently thin layer (preferably between 0.1 and 10 $\mu$m) such that accumulated thermal stresses on cooling down will not exceed the physical limits of GaN. Alternatively, a thicker layer (up to 100 $\mu$m) may be deposited if the resulting film has lower potential for thermal stress accumulation, due to its higher defect density or increased surface roughness. It is primarily important, however, that first layer 705 cannot crack during deposition or during cooling down to a subsequent processing temperature. First layer 705 may also be composed of a plurality of layers of varying thickness and composition, as needed.

In FIG. 7*b*), a laser beam 706 impinges in-situ upon the backside of starting wafer 701, coming through the slit or window 704 in susceptor 703. Starting wafer 701 does not absorb the laser light, whereas the GaN at the interface 707 between the starting substrate and the first layer, does. Laser light 706 is strongly absorbed at the interface 707, where it disrupts the Ga—N bonds, leading to a loss of coherency 708 between the lattice of the starting substrate 701 and the first layer 705. Depending on factors such as laser pulse energy, peak power, pulse duration, spot size, beam scan rate, etc. the desired loss of coherency can be adjusted from partial (fewer than 5% of bonds broken) to complete (100% of bonds broken.)

This laser process is performed in-situ in the growth reactor, the starting substrate 701 is not unloaded during the procedure. The wafer may be kept at or above the growth temperature (typically between 1000–1100° for GaN, lower for indium gallium nitride-based alloys) to eliminate thermal mismatch effects during the process. Alternatively, the wafer may be cooled to an intermediate temperature below the growth temperature for the procedure. In the case that the procedure occurs at a temperature above 600° C., it may be necessary to supply a non-inert nitrogen bearing atmosphere (such as ammonia $NH_3$) to prevent the surface of first layer 705 from thermally-induced decomposition. In other cases, however, it may be desirable to perform the laser procedure at lower temperatures.

In FIG. 7*c*), the second layer 709 is grown on top of the first layer 705. The thickness of this layer may be set arbitrarily; for use as a substrate, the thickness of layer 709 is typically between 50 and 500 $\mu$m. The deposition conditions for depositing layer 709 may be the same as, or different from the conditions used for the deposition of layer 705. Second layer 709 may also be grown substantially simultaneously with the laser process, without interruption between the steps. Together, layers 705 and 709 merge to form a composite layer 710.

In FIG. 7*d*) the starting substrate 701 and composite layer 710 are subjected to an in-situ laser process. A laser beam 706' is applied to the backside of the starting substrate 701 to effect the complete disruption of the Ga—N bonds at the interface, allowing the release of the composite layer 710 from the starting substrate. The laser beam 706' in this step may be different from the laser beam 706 in the earlier laser step shown in FIG. 7*b*.

If the initial level of Ga— (or In— or Al—)N bond disruption caused during the first laser step was sufficiently high (>99%), this step will be unnecessary, as the accumulated strain during the cooling process will concentrate the stresses on the remaining bonds, causing the composite layer to spontaneously shear away from the starting substrate, Alternatively, it is possible to perform the second laser process ex-situ, out of the reactor, if it is so desired, or to use an alternative method to separate the substrate from the composite layer, such as a lapping and polishing technique. Regardless of the method, the next result, as shown in FIG. 7*e*) is the complete crack-free separation of the composite layer 710 from the starting substrate 701 to form a freestanding, crack-free GaN substrate 711.

Figure 8:
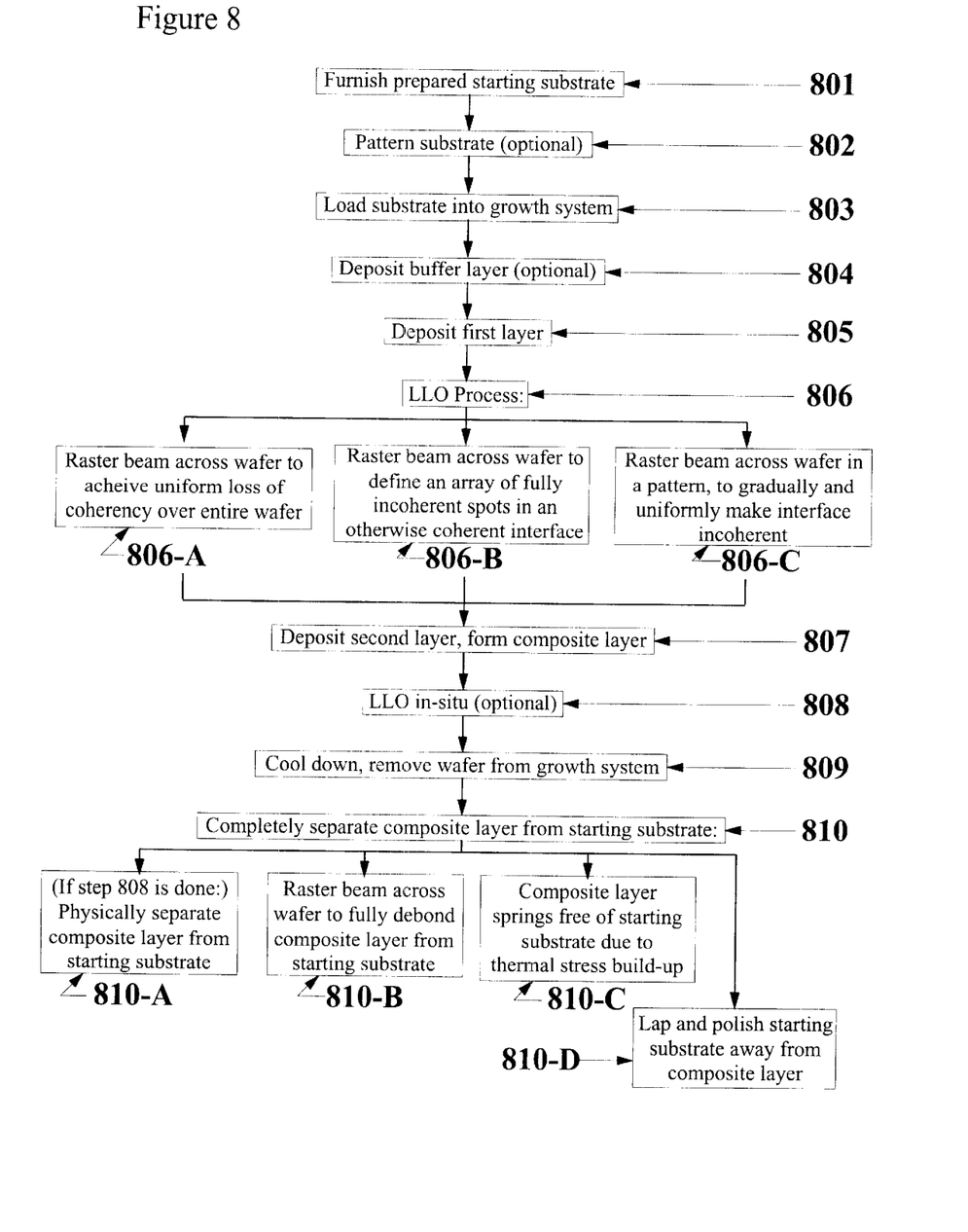

FIG. 8 schematically shows the series of steps involved in the method for producing a thick freestanding layer of GaN on a sapphire substrate, according to the second embodiment of the invention. Step 801 calls for the provision of a prepared substrate. In (optional) step 802, the prepared substrate has a mask pattern applied to its surface. The mask is intended to prevent growth except in the opened areas of the mask, in order to improve crystal quality or aid in the later separation. The mask may be of any material which inhibits growth on its surface and is compatible with the growth process; typically such masks are made of silicon oxide, silicon nitride, or silicon oxynitride.

The substrate is loaded into the growth system in step 803. In step 804, an optional low temperature buffer layer is set down, prior to step 805, where the initial layer of GaN is deposited onto the sapphire. This layer may consist of a single layer deposited at one temperature, or of a plurality of layers of different compositions, deposited at different temperatures.

In step 806 the backside of the substrate is illuminated with the laser beam 706, in situ, through the slit or window 704 in susceptor 703 for the partial to completed disruption of the Ga—N bonds linking starting substrate 701 to the first layer 705. Typically, this can be done using different methods, as described herein.

In one alternative step 806-A the laser pulse intensity, pulse width, and/or scan rate are modulated such that each spot induces a uniform but incomplete loss of coherency between the lattice of the GaN layer and the lattice of the sapphire substrate. The entire wafer is uniformly illuminated, and experiences a uniform loss of coherency of between 5% and greater than 99% between the two lattices.

In method 806-B, the pulse intensity, width, spot size, etc. are set to cause total disruption of the coherency at the interface of the lattice of the GaN and the lattice of the sapphire starting substrate 701. Each illuminated spot has total loss of coherency associated with it; however the beam is swept in such a manner that the entire surface is not illuminated uniformly. Some areas of the substrate are not exposed, and have total coherency maintained, whereas others are made completely incoherent by exposure. By choosing parameters such as spot pitch distance, the ratio of area made incoherent to the total area of the wafer can be adjusted from 5% up to greater than 99%.

Alternatively, in step 806-C, the laser spot may be rastered across the backside of the starting substrate in a pattern, such as a spiral, square, diagonal, etc. The effect is to disrupt the coherency between the lattice of the GaN and the sapphire starting substrate in a systematic fashion, reducing or eliminating the thermal stresses in a geometrically controlled way to avoid cracking.

Regardless of which method is used in step 806, laser beam 706 is typically from a tripled YAG or excimer laser, with a spot size of 50 μm to 500 μm, and a total fluence of between 300 mJ and 500 mJ per pulse. As this process is performed in-situ, it is possible to keep the wafer at an elevated temperature (up to or above the growth temperature, typically 1000–1100° C.) to eliminate the effects of thermal mismatch. If this is done at a temperature above 600° C., it will be necessary to have a non-inert nitrogen-bearing atmosphere (such as ammonia, $NH_3$) present to prevent the surface of the first layer from suffering the effects of thermal decomposition.

In step 807, the second layer 709 is deposited on top of the first layer 705. The thickness of the second layer 709 is preferably between 50 and 500 microns, more preferably 300 microns. The growth conditions for this layer may be the same as those used for the first layer 705, or they may differ in terms of growth rate, gas flows, partial pressures of precursor gases, temperature, etc. It is also within the scope of this invention to have step 807 occur concurrently with step 806, i.e. the interface disruption may occur at the same time as layer 709 is being deposited. Together, layers 705 and 709 merge to form a composite layer 710.

In (optional) step 808, the laser is again applied, in-situ, to the backside of the starting substrate 701. This time the laser is used to completely disrupt the bonds, allowing the composite layer to be removed from the starting substrate. Under certain circumstances, described herein, this step may be omitted in lieu of other steps 810-B, 810-C, or 810-D, below.

In step 809 the wafer is cooled once again and removed from the growth system. Although the total combined thickness of GaN on the starting wafer is considerable, the partially-to-completely isolated lattices of the starting substrate 701 and first layer 705 do not transmit stresses effectively, preventing crack formation.

In step 810 the composite layer 710 is removed from the starting substrate 701. There are different methods by which this may be accomplished, as described herein.

In method 810-A, which assumes that optional laser step 808 was done, the composite layer can be physically lifted or dragged free of the sapphire substrate.

In one alternative step 810-B, the cooled wafer may be affixed into an ex-situ LLO apparatus. This time, the laser is used to completely disrupt 100% of the bonds at the interface, allowing for the straightforward physical removal of the composite layer by sliding it off the sapphire wafer.

Alternatively, in step 810-C, the few remaining bonds that were left from the first laser step 806 may serve to concentrate the now-intensified thermal stress induced by the thicker composite layer 710. As the starting substrate 701 and composite layer 710 cool to ambient temperature, the concentrated stress exceeds the physical limits of the GaN at the interface, causing the composite layer to spontaneously shear away from the sapphire substrate.

In method 810-D, the composite layer 710 is separated from the sapphire by methods such as lapping or polishing the backside of the sapphire away. As the coherency of the interface 707 was already significantly reduced in the first laser step 806, the wafer does not experience the severe bowing that otherwise would be evident on such a wafer with a thick layer deposited onto it.

Regardless of which method is used in step 810, the end result is a freestanding, crack-free GaN substrate 711.

The foregoing embodiments are set forth for the purpose of example, and should not be construed as limiting the present invention. The present teaching may be applied to other types of apparatuses and methods. The description of the present invention is intended to be illustrative and not limiting the scope of the appended claims. Alternatives, modifications, and variations on this method will be apparent to those skilled in the art.

What is claimed is:

1. A method for the production of a crack-free Group III-Nitride layer comprising the following steps:
    a) growing a crack-free first layer of Group III-Nitride on a starting substrate;
    b) achieving a partial to complete loss of coherency between a lattice of the first layer and a lattice of the starting substrate;
    c) growing a second layer to form a composite layer without separating the first layer from the starting substrate, wherein the composite layer includes the first layer and the second layer, and wherein the first layer is between the second layer and the starting substrate.

2. A method according to claim 1, wherein the starting substrate includes a material selected from the group consisting of one or more of the following: sapphire, a transparent III–V substrate, silicon carbide, zinc oxide, magnesium oxide, a silicon oxide, lithium aluminate, lithium gallate, and/or lithium aluminum gallate.

3. A method according to claim 1, wherein the first layer is grown using vapor phase epitaxy (VPE), or chemical vapor deposition (CVD), or metal-organic chemical vapor deposition (MOCVD), or hydride vapor phase epitaxy (HVPE), or molecular beam epitaxy (MBE), or sputtering, or pulsed laser deposition.

4. A method according to claim 1, wherein the second layer is grown using vapor phase epitaxy (VPE), or chemical vapor deposition (CVD), or metal-organic chemical vapor deposition (MOCVD), or hydride vapor phase epitaxy (HVPE), or molecular beam epitaxy (MBE), or sputtering, or pulsed laser deposition.

5. A method according to claim 1, wherein the first layer may be a plurality of layers.

6. A method according to claim 1, wherein the second layer may be a plurality of layers.

7. A method according to claim 1, wherein the partial to complete loss of coherency in step b) is achieved by absorption of photons at the first layer.

8. A method according to claim 7 wherein the photons impinge upon the back side of the starting substrate, and whereby the photons are largely able to pass unabsorbed through the starting substrate.

9. A method according to claim 7 wherein the photons are generated by a laser.

10. A method according to claim 9 wherein the laser emits photons that are largely unabsorbed by the starting substrate but are strongly absorbed by the first layer.

11. A method according to claim 10 wherein the partial to complete loss of coherency is modulated by varying a profile, size, shape, energy fluence, intensity, pulse duration, pulse frequency, and/or step pitch of a beam from the laser.

12. A method according to claim 10, wherein the laser is scanned in a pattern across the starting substrate to minimize the effects of non-uniform stress induced by the partial to complete loss of coherency between the first layer and the starting substrate.

13. A method according to claim 12 wherein the pattern is a spiral starting from the outside edge of the starting substrate, working inward.

14. A method according to claim 13 wherein the laser emits light with an energy of between about 3.45 electron volts (eV) and 9.9 eV.

15. A method according to claim 1, further comprising the step of depositing a third layer between the starting substrate and the first layer.

16. A method according to claim 15, wherein the third layer includes silicon, silicon oxide, silicon nitride, or silicon oxynitride.

17. A method according to claim 15, wherein the third layer is patterned.

18. A method according to claim 1, further comprising the step of depositing a fourth layer between the first layer and the second layer.

19. A method according to claim 18, wherein the fourth layer includes silicon, silicon oxide, silicon nitride, or silicon oxynitride.

20. A method according to claim 18, wherein the fourth layer is patterned.

21. A method according to claim 1, whereby the partial to complete loss of coherency is achieved at an elevated temperature (between 30° C. and 1200° C.) to minimize damage due to thermal mismatch stresses.

22. A method according to claim 1, further comprising: during step b) exposing the first layer and/or starting substrate to a non-inert nitrogen-bearing gas to prevent the loss of nitrogen from the first layer.

23. A method according to claim 22, wherein the non-inert nitrogen-bearing gas is ammonia.

24. A method according to claim 1, whereby the partial to complete loss of coherency is achieved in-situ, in a growth system.

25. A method, according to claim 24, whereby the partial to complete loss of coherency is achieved at an elevated temperature (between 30° C. and 1200° C.) to minimize damage due to thermal mismatch stresses.

26. A method according to claim 24 further comprising: exposing the first layer and/or starting substrate to a non-inert nitrogen-bearing gas to prevent the loss of nitrogen from the first layer.

27. A method according to claim 26, wherein the non-inert nitrogen-bearing gas is ammonia.

28. A method according to claim 1 wherein steps b) and c) are performed substantially simultaneously.

29. A method according to claim 1, wherein one or more of the first and second layers includes GaN, AlN, InN or any alloy combination of these materials.

30. A method for the production of a freestanding crack-free Group III-Nitride layer comprising the following steps:
 a) growing a crack-free first layer of Group III-Nitride on a starting substrate;
 b) achieving a partial to complete loss of coherency between a lattice of the first layer and a lattice of the starting substrate;
 c) growing a second layer to form a composite layer without separating the first layer from the starting substrate, wherein the composite layer includes the first layer and the second layer, and wherein the first layer is between the second layer and the starting substrate;
 d) separating the starting substrate from the composite layer.

31. A method according to claim 30, wherein one or more of the first and second layers includes GaN, AlN, InN or any alloy combination of these materials.

32. A freestanding crack-free Group III-Nitride layer produced according to the method of claim 31.

33. The freestanding crack-free Group III-Nitride layer of claim 32, wherein the Group III-Nitride includes a material chosen from the group consisting of Gallium Nitride, Aluminum Nitride, Indium Nitride or any alloy combination of these materials.

34. The freestanding crack-free Group III-Nitride layer of claim 32, wherein the first layer includes a plurality of layers.

35. The freestanding crack-free Group III-Nitride layer of claim 32, wherein the second layer includes a plurality of layers.

36. The freestanding crack-free Group III-Nitride layer of claim 32, wherein the first layer absorbs photons with an energy of between about 3.45 electron volts (eV) and 9.9 eV.

37. The freestanding, crack-free Group III-Nitride layer of claim 32, further comprising a third layer disposed such that the first layer is between the third layer and the second layer.

38. The freestanding, crack-free Group III-Nitride layer of claim 32, further comprising a fourth layer disposed between the first layer and the second layer.

39. The freestanding, crack-free Group III-Nitride layer of claim 32 wherein the first layer has a thickness of between about 0.1 $\mu$m and 100 $\mu$m.

40. The freestanding, crack-free Group III-Nitride layer of claim 32 wherein the first layer has a thickness of between about 0.1 $\mu$m and 10 $\mu$m.

41. The freestanding, crack-free Group III-Nitride layer of claim 32 wherein the second layer has a thickness of between about 50 $\mu$m and 500 $\mu$m.

42. A method according to claim 30, wherein the starting substrate includes a material selected from the group consisting of one or more of the following: sapphire, a transparent III–V substrate, silicon carbide, zinc oxide, magnesium oxide, a silicon oxide, lithium aluminate, lithium gallate, and/or lithium aluminum gallate.

43. A method according to claim 30, wherein the first layer is grown using vapor phase epitaxy (VPE), or chemical vapor deposition (CVD), or metal-organic chemical vapor deposition (MOCVD), or hydride vapor phase epitaxy (HVPE), or molecular beam epitaxy (MBE), or sputtering, or pulsed laser deposition.

44. A method according to claim 30, wherein the second layer is grown using vapor phase epitaxy (VPE), or chemical vapor deposition (CVD), or metal-organic chemical vapor deposition (MOCVD), or hydride vapor phase epitaxy (HVPE), or molecular beam epitaxy (MBE), or sputtering, or pulsed laser deposition.

45. A method according to claim 30, wherein the first layer may be a plurality of layers.

46. A method according to claim 30, wherein the second layer may be a plurality of layers.

47. A method according to claim 30, wherein the partial to complete loss of coherency in step b) is achieved by absorption of photons at the first layer.

48. A method according to claim 47 wherein the photons impinge upon the back side of the starting substrate, and whereby the photons are largely able to pass unabsorbed through the starting substrate.

49. A method according to claim 47 wherein the photons are generated by a laser.

50. A method according to claim 49 wherein the laser emits photons that are largely unabsorbed by the starting substrate but are strongly absorbed by the first layer.

51. A method according to claim 50 wherein the partial to complete loss of coherency is modulated by varying a profile, size, shape, energy fluence, intensity, pulse duration, pulse frequency, and/or step pitch of a beam from the laser.

52. A method according to claim 51, wherein the laser is scanned in a pattern across the starting substrate to minimize the effects of non-uniform stress induced by the partial to complete loss of coherency between the first layer and the starting substrate.

53. A method according to claim 52 wherein the pattern is a spiral starting from the outside edge of the starting substrate, working inward.

54. A method according to claim 50 wherein the laser emits light with an energy of between about 3.45 electron volts (eV) and 9.9 eV.

55. A method according to claim 30, further comprising the step of depositing a third layer between the starting substrate and the first layer.

56. A method according to claim 55, wherein the third layer includes silicon, silicon oxide, silicon nitride, or silicon oxynitride.

57. A method according to claim 55, wherein the third layer is patterned.

58. A method according to claim 30, further comprising the step of depositing a fourth layer between the first layer and the second layer.

59. A method according to claim 58, wherein the fourth layer includes silicon, silicon oxide, silicon nitride, or silicon oxynitride.

60. A method according to claim 58, wherein the fourth layer is patterned.

61. A method according to claim 30, whereby the partial to complete loss of coherency is achieved at an elevated temperature (between 30° C. and 1200° C.) to minimize damage due to thermal mismatch stresses.

62. A method according to claim 30, further comprising: during step b) exposing the first layer and/or starting substrate to a non-inert nitrogen-bearing gas to prevent the loss of nitrogen from the first layer.

63. A method according to claim 62, wherein the non-inert nitrogen-bearing gas is ammonia.

64. A method according to claim 30, whereby the partial to complete loss of coherency is achieved in-situ, in a growth system.

65. A method, according to claim 64, whereby the partial to complete loss of coherency is achieved at an elevated temperature (between 30° C. and 1200° C.) to minimize damage due to thermal mismatch stresses.

66. A method according to claim 64 further comprising: exposing the first layer and/or starting substrate to a non-inert nitrogen-bearing gas to prevent the loss of nitrogen from the first layer.

67. A method according to claim 66, wherein the non-inert nitrogen-bearing gas is ammonia.

68. A method according to claim 30 wherein steps b) and c) are performed substantially simultaneously.

69. A method, according to claim 30, wherein step d) includes cooling the wafer such that thermal mismatch stresses develop sufficiently to separate or disconnect the composite layer from the starting substrate.

70. A method, according to claim 30, wherein the complete separation in step d) is accomplished by the absorption of photons at the first layer.

71. A method, according to claim 70, wherein the photons are generated by a laser.

72. A method, according to claim 30, wherein the separation step d) may accomplished at an elevated temperature (between 30° C. and 1200° C.) to minimize damage due to thermal mismatch stresses.

73. A method, according to claim 30, wherein the separation step d) may be accomplished in-situ, without necessitating the removal of the starting substrate and composite layer from the growth system.

* * * * *